United States Patent
Fujiishi et al.

(10) Patent No.: US 6,703,287 B2
(45) Date of Patent: Mar. 9, 2004

(54) PRODUCTION METHOD FOR SHALLOW TRENCH INSULATION

(75) Inventors: Yoshitaka Fujiishi, Hyogo (JP); Atsushi Ueno, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 73 days.

(21) Appl. No.: 09/791,763

(22) Filed: Feb. 26, 2001

(65) Prior Publication Data

US 2001/0045620 A1 Nov. 29, 2001

(30) Foreign Application Priority Data

May 29, 2000 (JP) .......................................... 2000-157902

(51) Int. Cl.$^7$ ............................................. H01L 21/76
(52) U.S. Cl. ........................ 438/427; 438/424; 438/778; 438/791; 438/296
(58) Field of Search ................................. 438/427, 424, 438/778, 791, 296

(56) References Cited

U.S. PATENT DOCUMENTS

| 5,674,650 A | * | 10/1997 | Dirksen et al. |
| 6,169,012 B1 | * | 1/2001 | Chen et al. |
| 6,171,896 B1 | * | 1/2001 | Jang et al. |
| 6,303,460 B1 | * | 10/2001 | Iwamatsu |

* cited by examiner

Primary Examiner—Long Pham
(74) Attorney, Agent, or Firm—McDermott, Will & Emery (57) ABSTRACT

An improved method for producing a semiconductor device in which overpolishing is prevented at a chemical mechanical polishing time to eliminate the influence of peripheries on the object part. A plasma oxide film is formed on a semiconductor substrate so as to fill a recess and a trench. With the use of a resist film as a mask, the plasma oxide film is selectively etched to leave an overpolish-preventing support member in a neighborhood of the recess, which is a photo-related mark, for providing a support against overpolishing at a chemical mechanical polishing time. The surface of the semiconductor substrate is polished by chemical mechanical polishing. Thereafter, a nitride film and an oxide film are removed.

4 Claims, 12 Drawing Sheets

PRODUCTION METHOD FOR SHALLOW TRENCH INSULATION

BACKGROUND OF THE INVENTION

1. Field of the Invention

The present invention generally relates to a method of producing a semiconductor device, and more specifically to an improved method of producing a semiconductor device in which overpolishing at a chemical mechanical polishing time is prevented to eliminate the influence of peripheries on the object part. The present invention is also related to a semiconductor device produced by such a method.

2. Description of the Background Art

Figure 14:
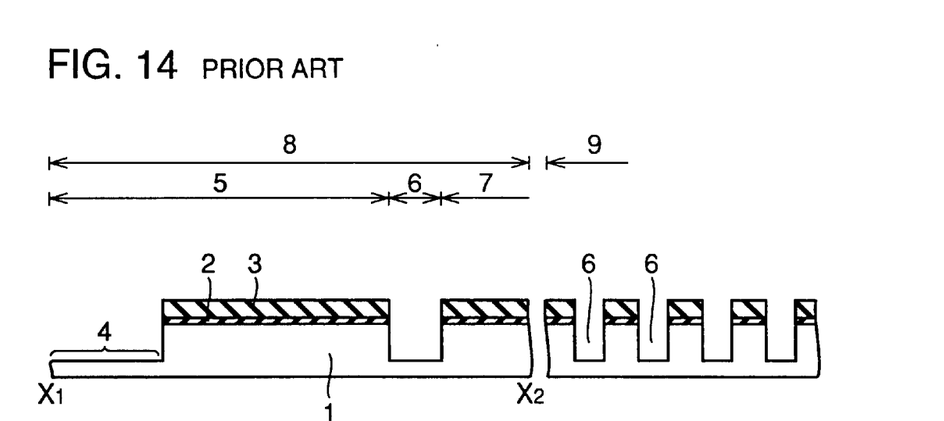
FIG. 14 is a cross-sectional view illustrating a semiconductor device at the first step in the order of a conventional method for producing the semiconductor device.

In the following description, an alignment mark of a stepper is used as an example of a photo-related mark. FIG. 14 is a cross-sectional view of a densely aggregated pattern (object part) 9 and a chip periphery part (including a dicing part) 8.

Figure 15:
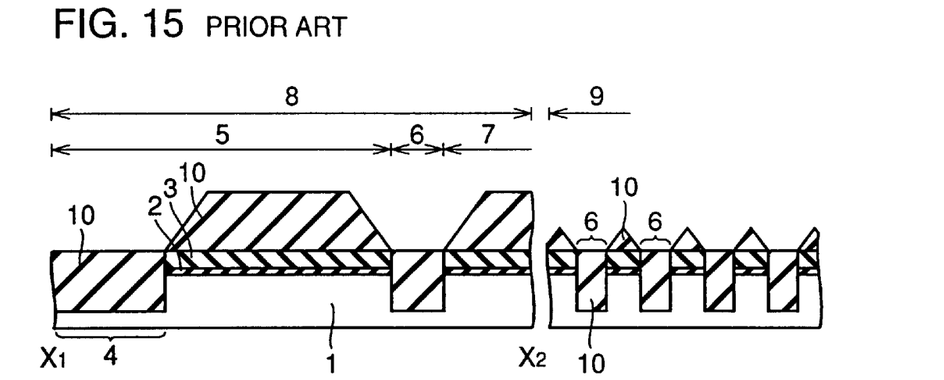
FIG. 15 is a cross-sectional view illustrating a semiconductor device at the second step in the order of the conventional method for producing the semiconductor device.

Referring to FIG. 14, an oxide film 2 and a nitride film 3 are successively formed on a silicon substrate 1. By a conventional photolithography and etching technique, an isolation part 6 and a photo-related mark part 4 are formed. Referring to FIG. 15, a high-density plasma oxide film 10 is buried in the isolation part 6 and the photo-related mark part 4. This forms an isolation region. According as the size reduction proceeds, the active region will become smaller due to a bird's beak by the LOCOS technique, so that such an isolation technique is used.

At this time, referring to FIG. 15, the high-density plasma oxide film 10 is formed on the isolation part 6, the photo-related mark part 4 and the nitride film 3, since the high-density plasma oxide film 10 is deposited while maintaining anisotropy. A step difference corresponding to the height of the high-density plasma oxide film 10 formed on the nitride film 3 is generated on the silicon substrate 1. Also, since the active region is small in the densely aggregated pattern (object part) 9, the high-density plasma oxide film 10 is deposited successively from the isolation part 6, and intersects at a central part of the active region. Therefore, as shown in the drawings, the high-density plasma oxide film 10 has a cross section shape like a mountain in the densely aggregated pattern part 9 to form a ridge. The height of the high-density plasma oxide film 10 formed on the active region will be smaller than the thickness of the high-density plasma oxide film 10 formed on the chip peripheral part 8. For this reason, there will be a step difference between a coarse pattern such as the chip peripheral part (including the dicing part) 8 and the densely aggregated pattern (object part) 9.

Figure 20:
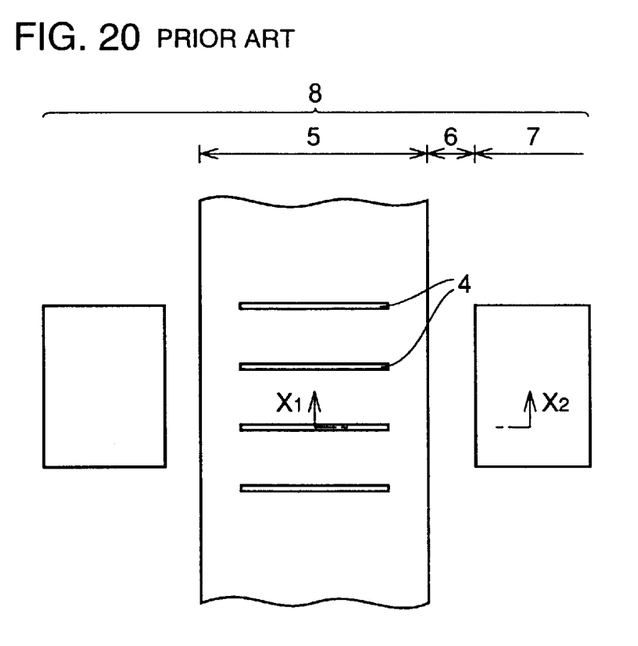
FIG. 20 is a plan view of the semiconductor device shown in FIG. 15.

FIG. 20 is a plan view of the semiconductor device shown in FIG. 15. Namely, FIG. 15 is a cross-sectional view along the line $X_1$–$X_2$ of FIG. 20.

In order not to leave the aforesaid step difference to the later steps, the surface of the silicon substrate 1 is polished by chemical mechanical polishing technique (hereafter referred to as CMP); however, even if it is directly subjected to CMP, the high-density plasma oxide film 10 will remain or the CMP does not stop at the surface of the nitride film and causes overpolishing, since the step difference is too large.

Figure 16:
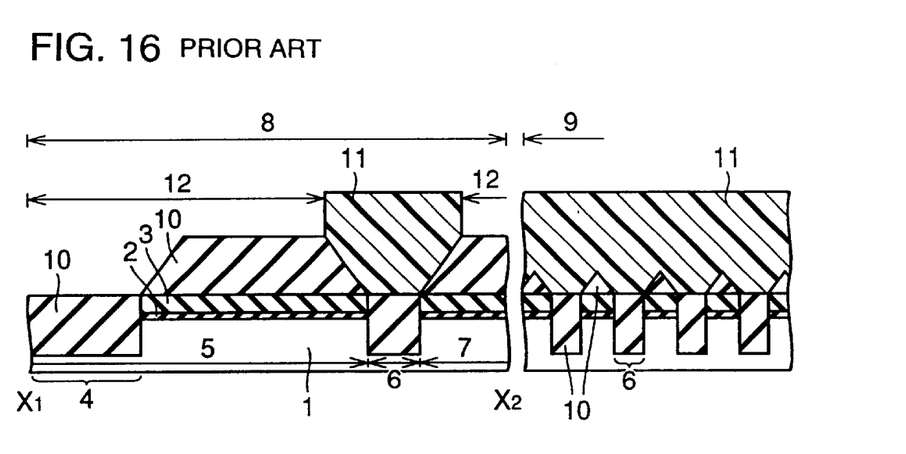
FIG. 16 is a cross-sectional view illustrating a semiconductor device at the third step in the order of the conventional method for producing the semiconductor device.

Therefore, in the conventional technique, a resist film 11 is formed on the isolation part 6, as shown in FIG. 16. Next, referring to FIGS. 16 and 17, the high-density plasma oxide film 10 is removed by etching with the use of the resist film 11 as a mask. Hereafter, such removal of a large high-density plasma oxide film 10 on the active region in advance before CMP polishing, will be referred to as pre-etching.

In order to define the size of the active region where the pre-etching is to be performed, a superposition shift at the time of photolithography for pre-etching and the margin of the variation of the resist dimension will be required, Since the high-density plasma oxide film 10 is deposited obliquely at pattern edges, the oblique portion will be 0.4 to 0.5 $\mu$m if the deposited amount is 0.4 to 0.5 $\mu$m, thereby requiring a margin of 0.4 to 0.5 $\mu$m on one side.

Figure 17:
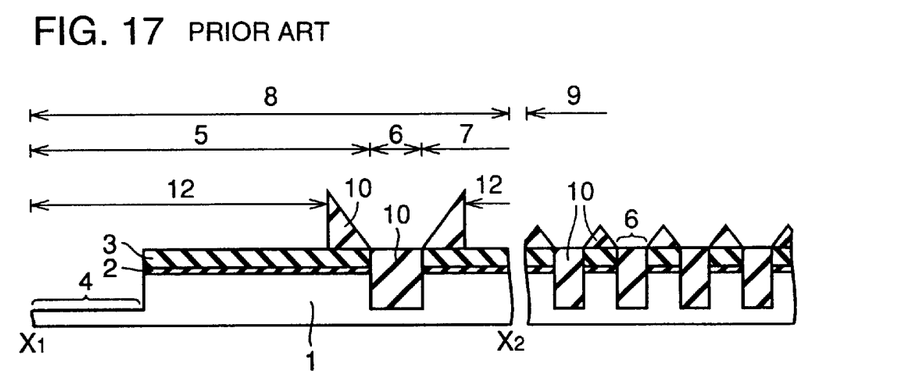
FIG. 17 is a cross-sectional view illustrating a semiconductor device at the fourth step in the order of the conventional method for producing the semiconductor device.

Though it depends on the conforming degree of the pre-etching photolithography to the size reduction, the active region that can be pre-etched must have a pattern with a size larger than 1.0 to 2.0 $\mu$m. Therefore, it is not possible to pre-etch a fine pattern having an active region smaller than 1.0 $\mu$m, such as a memory device cell. Concerning the photo-related mark part 4, the buried high-density plasma oxide film 10 is etched at the pre-etching time, as shown in FIG. 17. This is due to the following reason. In superposition of a transfer gate (TG) and a later-step layer, if a metal-series material is used in the superposed layer, the precision drops if there is no step difference (if it is directly subjected to CMP, it is planarized to remove the step difference) between the superposed layer and the foundation layer (FL).

Even if the high-density plasma oxide film 10 of the photo-related mark part 4 is not etched at the pre-etching time, a step (photolithography, etching) of removing the high-density plasma oxide film 10 of the photo-related mark part 4 is needed somewhere for superposition with the layer in a later step. Therefore, in a prior art technique, the high-density plasma oxide film 10 of the photo-related mark part 4 is etched at the pre-etching time for step reduction (cost reduction).

Figure 21:
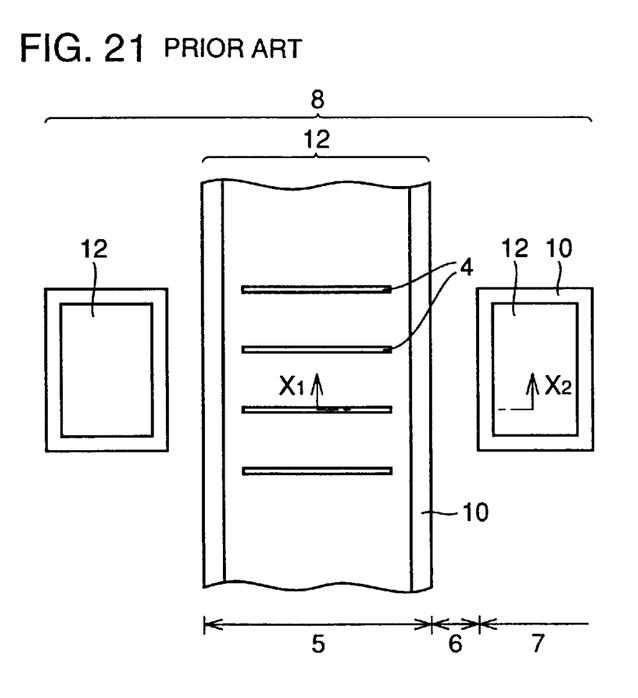
FIG. 21 is a plan view of the semiconductor device shown in FIG. 17.

FIG. 21 corresponds to a plan view of the device shown in FIG. 17. Namely, FIG. 17 is a cross-sectional view along the line $X_1$–$X_2$ of FIG. 21.

Referring to FIG. 21, the high-density plasma oxide film 10 is removed by etching at the photo-related mark part 4.

Figure 18:
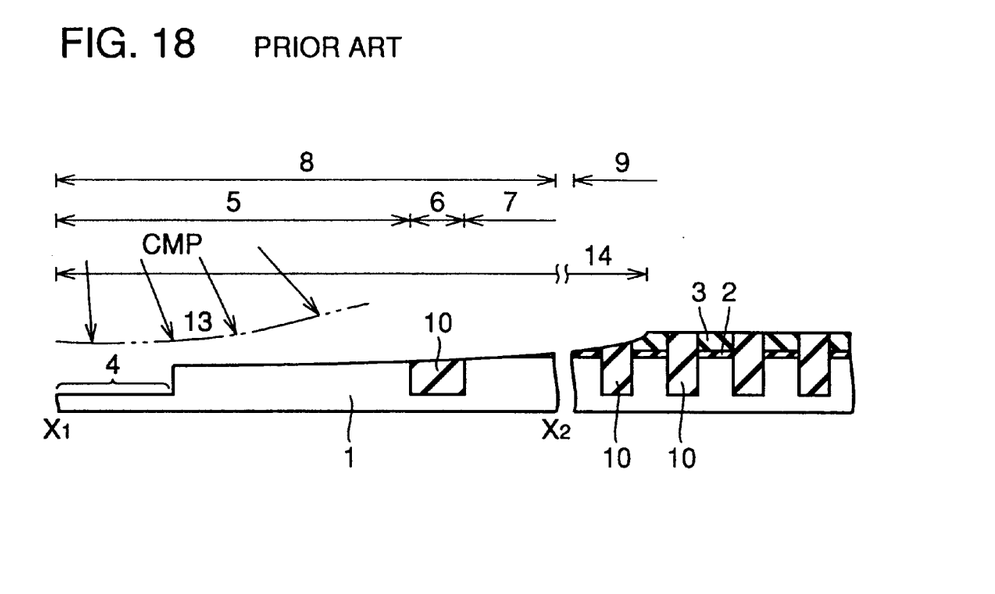
FIG. 18 is a cross-sectional view illustrating a semiconductor device at the fifth step in the order of the conventional method for producing the semiconductor device.

Referring to FIG. 18, a surface of the silicon substrate 1 is polished by CMP. This removes the high-density plasma oxide film 10 on the nitride film 3. At this time, in the prior art technique, there is a step difference generated at the photo-related mark part 4, and the polishing pressure 13 of CMP is applied thereon to a greater extent than on the other parts, and also slurries caused by chemical polishing are liable to be deposited at the step difference part.

Therefore, at the step difference of the photo-related mark part 4, chemical polishing also proceeds to a greater extent than at the other parts. Also, since the high-density plasma oxide film 10 to be removed by CMP is absent, the nitride film 3 is directly polished at the CMP time, whereby the nitride film 3 is also liable to be shaven. Therefore, if the CMP polishing is carried out to such an extent as to remove the high-density plasma oxide film 10 which is on the nitride film 3 of the densely aggregated pattern 9, overpolishing 14 occurs at and near the center of the photo-related mark part 4. If excessive overpolishing 14 occurs, the region of the densely aggregated pattern 9 will also be overpolished.

Thereafter, referring to FIG. 19, when the nitride film 3 and the pad oxide film 2 are removed by a conventional technique, substrate shaving 15 occurs at the part shown by A in FIG. 19 or the high-density plasma oxide film 10 at the pattern edge drops down to a position below the surface of the silicon substrate 1.

Figure 19:
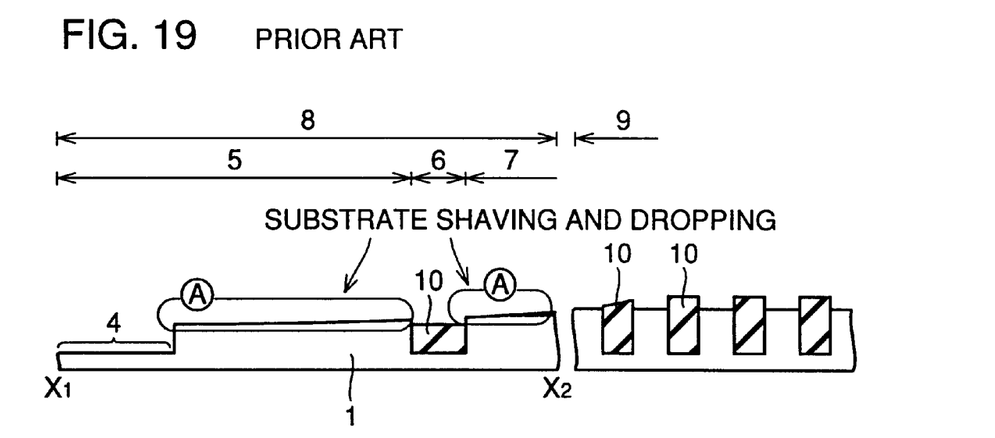
FIG. 19 is a cross-sectional view illustrating a semiconductor device at the sixth step in the order of the conventional method for producing the semiconductor device.
Figure 22:
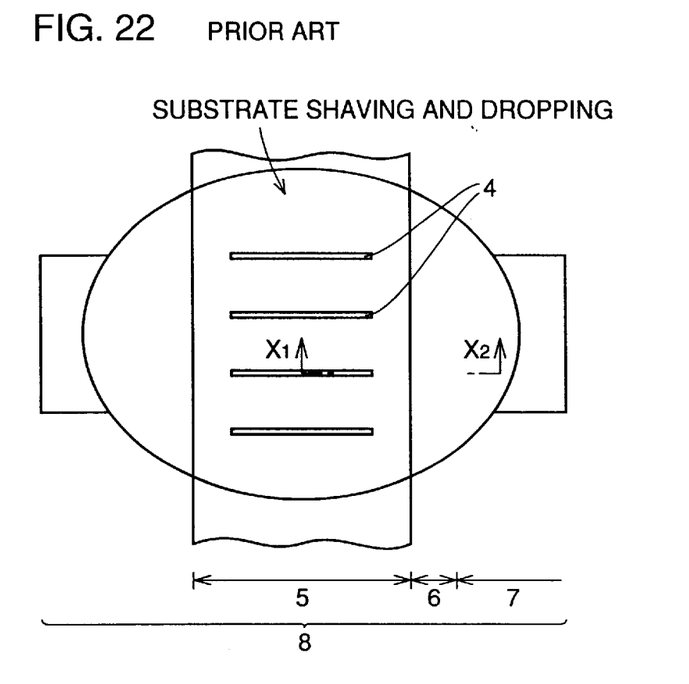
FIG. 22 is a plan view of the semiconductor device shown in FIG. 19.

FIG. 22 is a plan view of the device shown in FIG. 19. Namely, FIG. 19 is a cross-sectional view along the line $X_1$–$X_2$ of FIG. 22.

Figure 23:
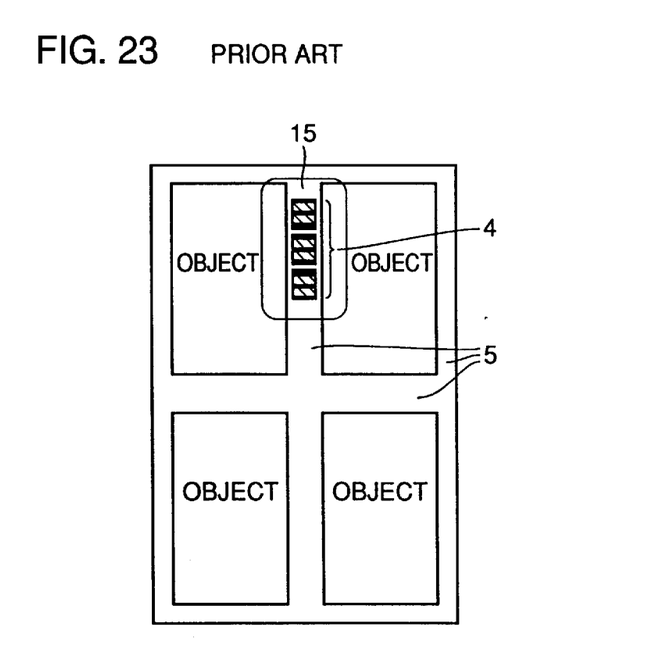
FIG. 23 is a view illustrating an arrangement of photo-related marks in a conventional semiconductor device.

FIG. 23 is a view illustrating a configuration of the photo-related mark part 4 in a conventional object part chip. If a plurality of such photo-related mark parts 4 are aggregated, the polishing pressure at the CMP time is further concentrated to increase the substrate shaving 15 or dropping that starts at that part. As the photo-related mark, there are a global mark used for superposition of a stepper or the like, an LSA mark and an FIA mark used for fine alignment, a mark used for the inspection of superposition, a vernier for eye inspection of photographs, and others. Even with the same mark, if the layers to be superposed are different, the same mark is needed for the number of the layers.

The substrate shaving causes substrate leakage or deterioration of the reliability of the gate oxide film, and dropping at the pattern edge causes an inverse narrow effect of the transistors and humps in the subthreshold characteristics to deteriorate the transistor characteristics. Also, if the degree of overpolishing is too much, the photo-related mark itself cannot be formed properly, and the detection precision also drops.

SUMMARY OF THE INVENTION

A principal object of the present invention is to provide an improved method for producing a semiconductor device in which such overpolishing by CMP is prevented to eliminate the influence of peripheries on the object part.

Another object of the present invention is to provide a semiconductor device produced by such a production method.

A method for producing a semiconductor device according to a first aspect of the present invention is directed to a method for producing a semiconductor device having a shallow trench isolation. First, an oxide film and a nitride film are successively formed on a semiconductor substrate in which an object part and a chip peripheral part including a dicing part are to be formed (first step). The oxide film and nitride film are patterned so that an opening is formed in a portion of the chip peripheral part where a photo-related mark is to be formed and in a portion of the object part where a trench is to be formed (second step). A surface of the semiconductor substrate is etched with the use of the patterned oxide film and nitride film as a mask so as to form the trench and to form a recess in the portion where the photo-related mark is to be formed (third step). A plasma oxide film is formed on the semiconductor substrate so as to fill the recess and the trench (fourth step). A resist film is formed on the plasma oxide film so as to cover the trench part and a portion of a neighborhood of the photo-related mark (fifth step). The plasma oxide film is selectively etched with the use of the resist film as a mask so as to leave an overpolish-preventing support member in the neighborhood of the photo-related mark for providing a support against overpolish at a chemical mechanical polishing time (sixth step). The resist film is removed (seventh step). The surface of the semiconductor substrate is polished by chemical mechanical polishing (eighth step). The nitride film and oxide film are removed (ninth step).

According to a preferable embodiment of the present invention, the etching of the sixth step is performed by selecting a pattern of the resist film so that the overpolish-preventing support member is left as a parallel stripe pattern on the plasma oxide film.

According to a further preferable embodiment of the present invention, the etching of the sixth step is performed by selecting a pattern of the resist film so that the overpolish-preventing support member is left as a dot pattern near the photo-related mark.

A method for producing a semiconductor device according to a second aspect of the present invention is directed to a method for producing a semiconductor device having a shallow trench isolation. First, an oxide film and a nitride film are successively formed on a semiconductor substrate in which an object part and a chip peripheral part including a dicing part are to be formed. The oxide film and nitride film are patterned so that an opening is formed in a portion of the chip peripheral part where a photo-related mark is to be formed and in a portion of the object part where a trench is to be formed. A surface of the semiconductor substrate is etched with the use of the patterned oxide film and nitride film as a mask so as to form the trench and to form a recess film in the portion where the photo-related mark is to be formed. A plasma oxide film is formed on the semiconductor substrate so as to fill the recess and the trench. A resist film is formed on the plasma oxide film so as to cover the trench part. The plasma oxide film is etched and removed with the use of the resist film as a mask. The resist film is removed. The surface of the semiconductor substrate is polished by chemical mechanical polishing. The nitride film and oxide film are removed. The second aspect of the present invention is characterized in that the photo-related mark is formed in a dispersed configuration instead of a concentrated configuration.

A semiconductor device according to a third aspect of the present invention is directed to a semiconductor device having a shallow trench isolation. The semiconductor device is produced through the following steps. First, an oxide film and a nitride film are successively formed on a semiconductor substrate in which an object part and a chip peripheral part including a dicing part are to be formed. The oxide film and nitride film are patterned so that an opening is formed in a portion of the chip peripheral part where a photo-related mark is to be formed and in a portion of the object part where a trench is to be formed. A surface of the semiconductor substrate is etched with the use of the patterned oxide film and nitride film as a mask so as to form the trench and to form a recess in the portion where the photo-related mark is to be formed. A plasma oxide film is formed on the semiconductor substrate so as to fill the recess and the trench. A resist film is formed on the plasma oxide film so as to cover the trench part and a portion of a neighborhood of the photo-related mark. The plasma oxide film is etched with the use of the resist film as a mask so as to leave an overpolish-preventing support member in the neighborhood of the photo-related mark for providing a support against overpolish at a chemical mechanical polishing time. The resist film is removed. The surface of the semiconductor substrate is polished by chemical mechanical polishing. The nitride film and oxide film are removed. An element is formed in the object part.

According to a preferable embodiment of the present invention, the etching is performed by selecting a pattern of the resist film so that the overpolish-preventing support member is left as a parallel stripe pattern on the plasma oxide film.

According to a further preferable embodiment of the present invention, the etching is performed by selecting a pattern of the resist film so that the overpolish-preventing support member is left as a dot pattern near the photo-related mark.

A semiconductor device according to a fourth aspect of the present invention is directed to a semiconductor device having a shallow trench isolation. The semiconductor device is produced through the following steps. First, an oxide film and a nitride film are successively formed on a semiconductor substrate in which an object part and a chip peripheral part including a dicing part are to be formed. The oxide film and nitride film are patterned so that an opening is formed in a portion of the chip peripheral part where a photo-related mark is to be formed and in a portion of the object part where a trench is to be formed. A surface of the semiconductor substrate is etched with the use of the patterned oxide film and nitride film as a mask so as to form the trench and to form a recess in the portion where the photo-related mark is to be formed. A plasma oxide film is formed on the semiconductor substrate so as to fill the recess and the trench. A resist film is formed on the plasma oxide film so as to cover the trench part. The plasma oxide film is etched and removed with the use of the resist film as a mask. The resist film is removed. The surface of the semiconductor substrate is polished by chemical mechanical polishing. The nitride film and oxide film are removed. An element is formed in the object part. The semiconductor device according to the fourth aspect of the present invention is characterized in that the photo-related mark is formed in a dispersed configuration instead of a concentrated configuration.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereafter, preferred embodiments of the present invention will be described with reference to the attached drawings.
First Embodiment First, the process goes through the same steps as in the prior art technique shown in FIGS. 14 and 15.

Figure 1:
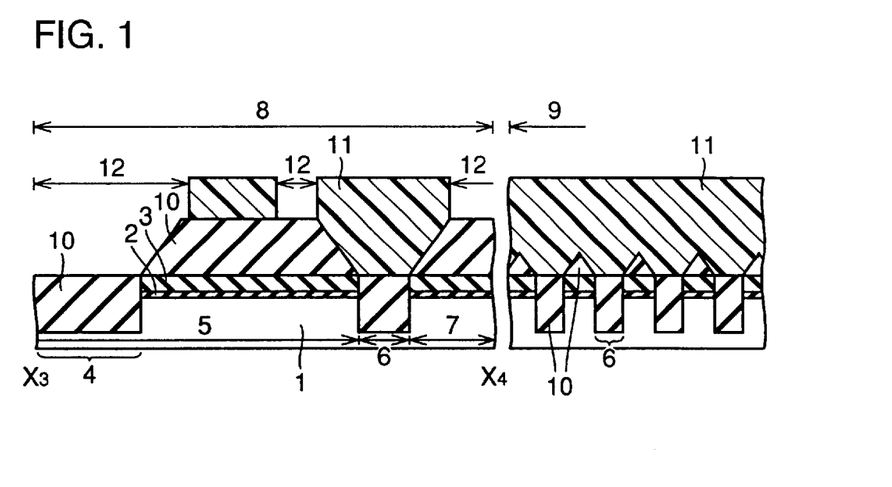
FIG. 1 is a cross-sectional view illustrating a semiconductor device at the first step in the order of a method for producing the semiconductor device according to a first embodiment of the present invention.

Next, referring to FIG. 1, a resist film 11 is formed on the plasma oxide film 10 to cover the trench part 6 and a portion of the neighborhood of the photo-related mark 4.

Figure 2:
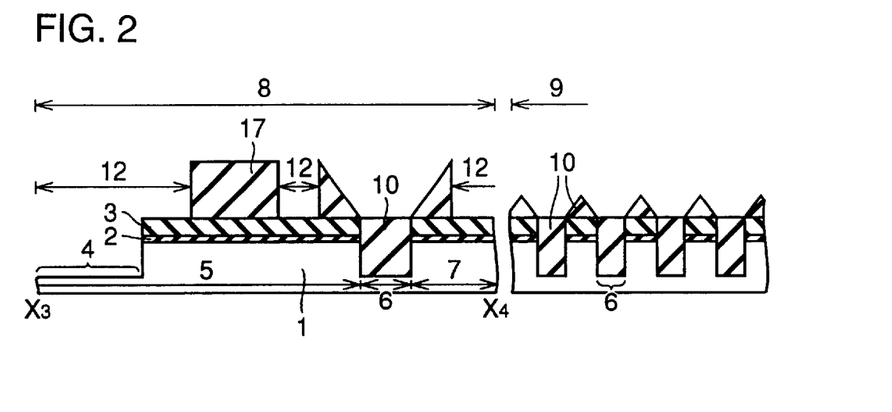
FIG. 2 is a cross-sectional view illustrating a semiconductor device at the second step in the order of the method for producing the semiconductor device according to the first embodiment of the present invention.

Referring to FIGS. 1 and 2, with the use of the resist film 11 as a mask, the plasma oxide film 10 is selectively etched to leave an overpolish-preventing support member 17 in the neighborhood of the photo-related mark 4 to provide a support against overpolishing at the chemical mechanical polishing time. The resist film 11 is removed.

Figure 3:
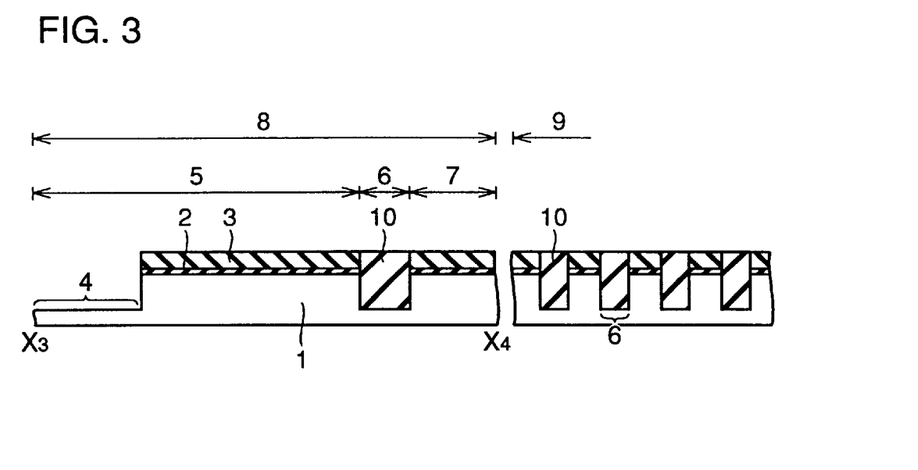
FIG. 3 is a cross-sectional view illustrating a semiconductor device at the third step in the order of the method for producing the semiconductor device according to the first embodiment of the present invention.

Referring to FIGS. 2 and 3, a surface of the silicon substrate 1 is polished by CMP.

Figure 4:
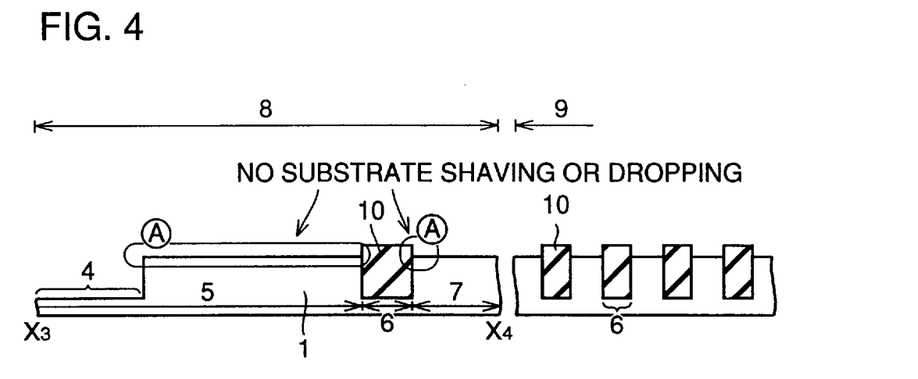
FIG. 4 is a cross-sectional view illustrating a semiconductor device at the fourth step in the order of the method for producing the semiconductor device according to the first embodiment of the present invention.
Figure 5:
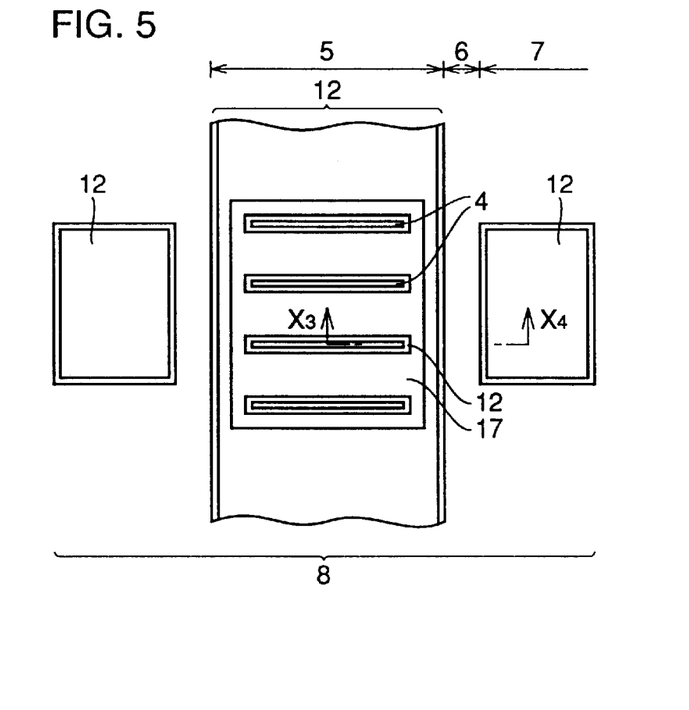
FIG. 5 is a plan view of the device shown in FIG. 2.

Referring to FIGS. 3 and 4, the nitride film 3 and the oxide film 2 are removed. FIG. 5 is a plan view of the device shown in FIG. 4. Namely, FIG. 4 is a cross-sectional view along the line $X_3$–$X_4$ of FIG. 5.

Now, referring to FIG. 1, description will be made on how much of the neighborhood of the photo-related mark part 4 is to be etched. The high-density plasma oxide film 10 buried in the photo-related mark part 4 will be removed if the etching is carried out up to a position distant by about 0.25 to 0.5 μm from the pattern edge of the photo-related mark part 4, by taking the superposition shift of photolithography at the pre-etching time and the variation of the resist film dimension into account.

Figure 6:
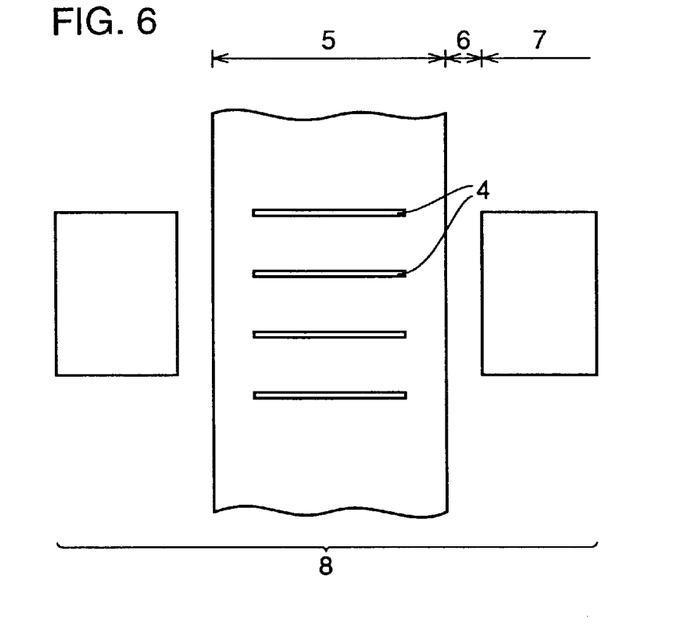
FIG. 6 is a plan view of the device shown in FIG. 4.

Referring to FIG. 3, according to this invention, even immediately after CMP, the overpolish-preventing support member 17 intentionally left at the CMP time functions to prevent overpolishing of the neighborhood of the photo-related mark part 4, so that the surface of the semiconductor substrate can be planarized without causing overpolishing. As a result, referring to FIGS. 4 and 6 (plan view of the device shown in FIG. 4), at the A part, there is no shaving of the surface of the silicon substrate near the photo-related mark part 4, and there is no dropping of the pattern edge, thereby producing a good shape. This can prevent substrate leakage, deterioration of the reliability of the gate oxide film, and deterioration of the transistor characteristics. Also, the uniformity of planarizing the whole surface of the chip and the detection precision of the photo-related mark will be improved.

Second Embodiment

In the first embodiment, the overpolish-preventing support member 17 left for prevention of overpolishing the neighborhood of the photo-related mark part 4 may possibly remain too much, so that there is a possibility that, even if other parts are polished, the overpolish-preventing support member 17 remains as a residual oxide film due to insufficient polishing. The second embodiment is for solving this problem.

First, the process goes through the same steps as in the prior art technique shown in FIGS. 14 and 15.

Figure 7:
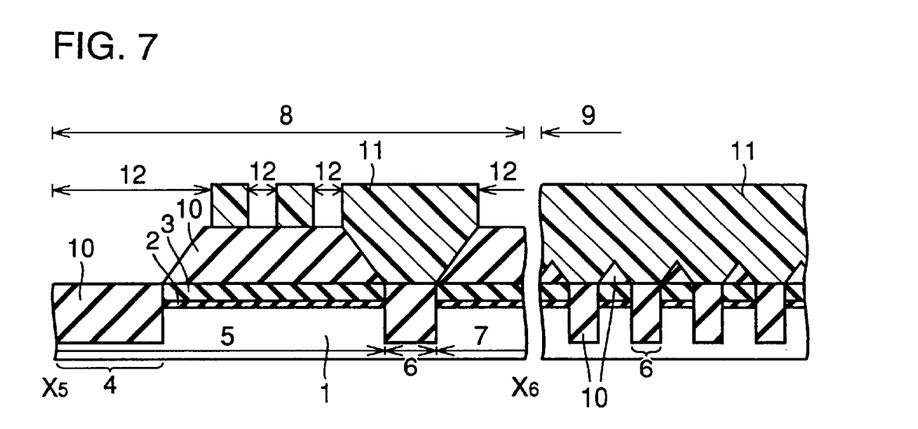
FIG. 7 is a cross-sectional view illustrating a semiconductor device at the first step in the order of a method for producing the semiconductor device according to a second embodiment of the present invention.
Figure 8:
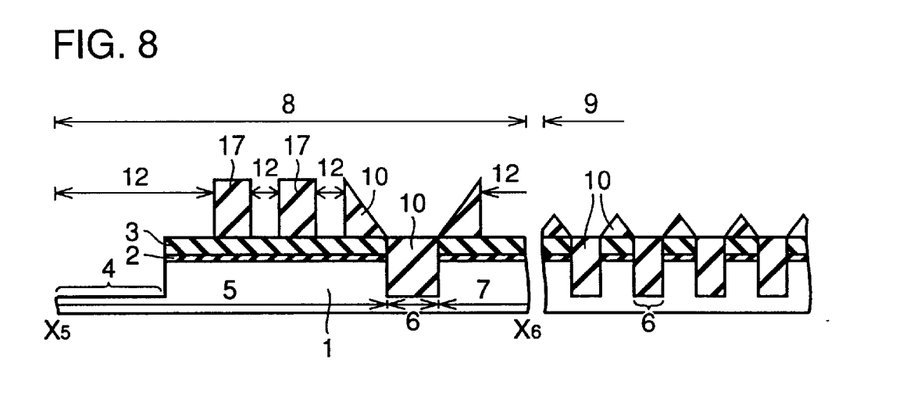
FIG. 8 is a cross-sectional view illustrating a semiconductor device at the second step in the order of the method for producing the semiconductor device according to the second embodiment of the present invention.
Figure 11:
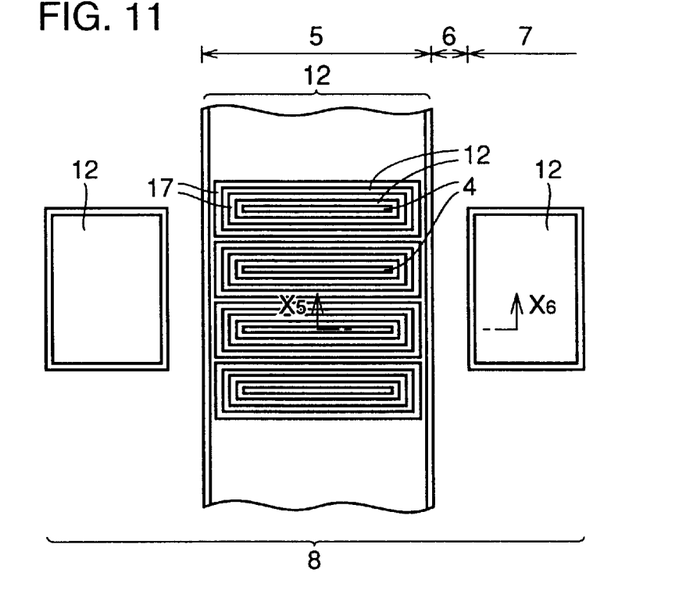
FIG. 11 is a plan view of the semiconductor device shown in FIG. 8.

Next, referring to FIGS. 7, 8, and 11 (plan view of the device shown in FIG. 8; namely, FIG. 8 is a cross-sectional view along the line $X_5$–$X_6$ of FIG. 11.), portions where the overpolish-preventing support member 17 is to be left and portions 12 where the high-density plasma oxide film is to be removed by pre-etching are alternately disposed to form a pattern that dissolves both overpolishing and insufficient polishing.

Referring again to FIG. 7, the resist film 11 is patterned so that the portions where the high-density plasma oxide film is to be left and the portions 12 to be pre-etched are alternately arranged on the active region of the dicing part 5 of the photo-related mark part 4. The patterning dimension at this time is preferably the minimum both in the drawn-out portions and in the remaining portions. The minimum dimension is different depending on the photolithography technique. Also, the ratio of the drawn-out portions to the remaining portions that are alternately disposed, is preferably 50%.

FIG. 8 shows a state after pre-etching. The device has a configuration such that the high-density plasma oxide film 17 and the pre-etched part 12 are alternately arranged.

Figure 9:
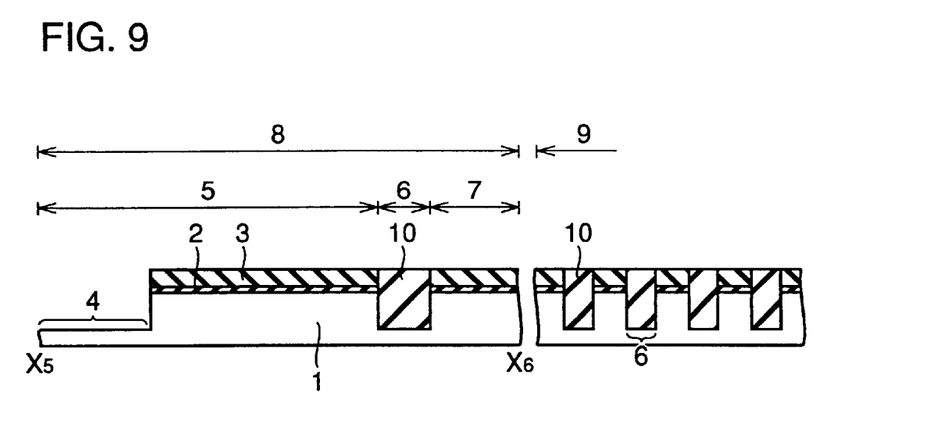
FIG. 9 is a cross-sectional view illustrating a semiconductor device at the third step in the order of the method for producing the semiconductor device according to the second embodiment of the present invention.

FIG. 9 is a cross-section view of a semiconductor device immediately after CMP. The high-density plasma oxide film 17 that is intentionally alternately left at the CMP time functions to prevent overpolishing and insufficient polishing of the neighborhood of the photo-related mark part 4 in planarizing the surface of the semiconductor substrate. It is when the area ratio of the drawn-out portions to the remaining portions is 50% that the margin is produced to the largest extent for preventing overpolishing and insufficient polishing.

Figure 10:
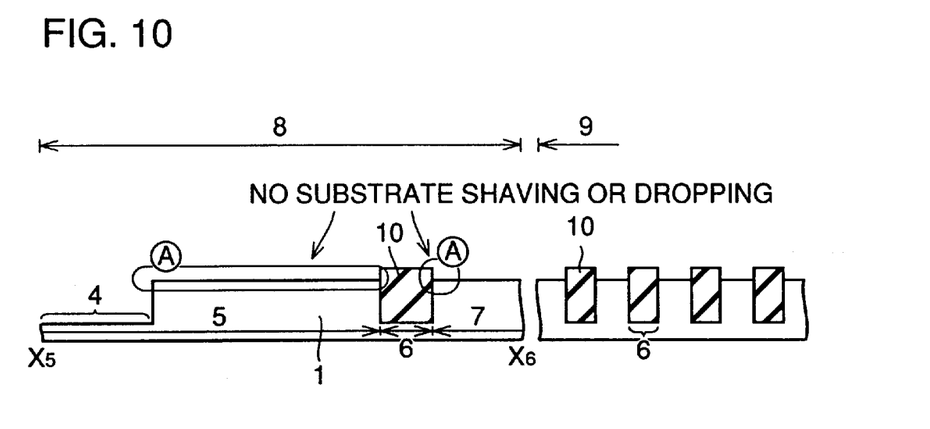
FIG. 10 is a cross-sectional view illustrating a semiconductor device at the fourth step in the order of the method for producing the semiconductor device according to the second embodiment of the present invention.

As a result, referring to FIG. 10, when the nitride film 3 and the pad oxide film 2 are removed, at the A part shown in FIG. 10, there is no shaving of the surface of the silicon substrate near the photo-related mark part 4, and there is no dropping of the pattern edge, thereby producing a good shape. This can prevent substrate leakage, deterioration of the reliability of the gate oxide film, and deterioration of the transistor characteristics. Also, the uniformity of planarizing the whole surface of the chip and the detection precision of the photo-related mark will be improved.

Third Embodiment

Figure 12:
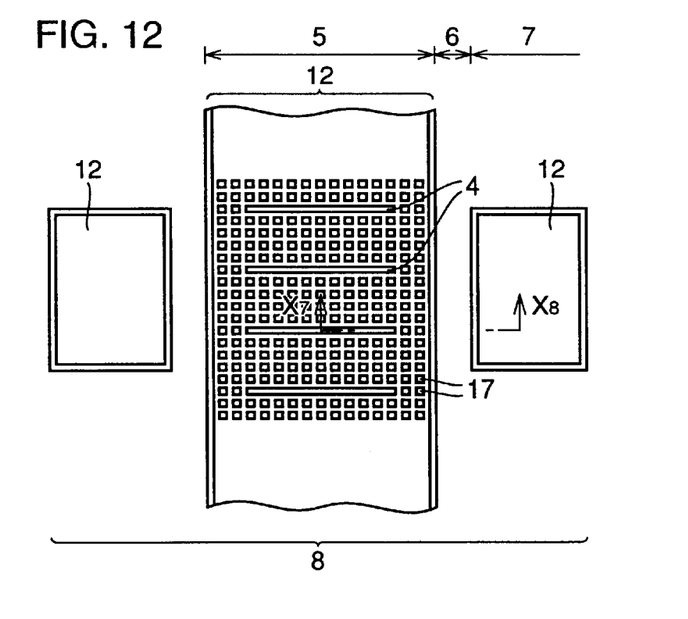
FIG. 12 is a plan view of a semiconductor device illustrating a method for producing the semiconductor device according to a third embodiment of the present invention.

FIG. 12 is a plan view of a semiconductor device according to the third embodiment of the present invention. FIG. 12 is a plan view of a part where the photo-related mark is formed.

The third embodiment is a modification of the first embodiment, where the remaining high-density plasma oxide film 17 for prevention of overpolishing the neighborhood of the photo-related mark part 4 has a dot pattern configuration. The patterning dimension at this time is sufficiently such that (remaining dots):(drawn-out parts)= $\sqrt{2}:(4-2\sqrt{2})$ so that the area ratio of the remaining parts to the drawn-out parts will be 50%. At this time, the area ratio in a predetermined area will be (remaining dots):(drawn-out parts)=1:1. Also, the dimension at this time is preferably the minimum both in the drawn-out portions and in the remaining portions. The cross-sectional view along the line $X_7$–$X_8$ in FIG. 12 will be a cross-sectional view similar to FIG. 8. By constructing in this manner, the same effect as in the first embodiment will be produced.

Fourth Embodiment

Figure 13:
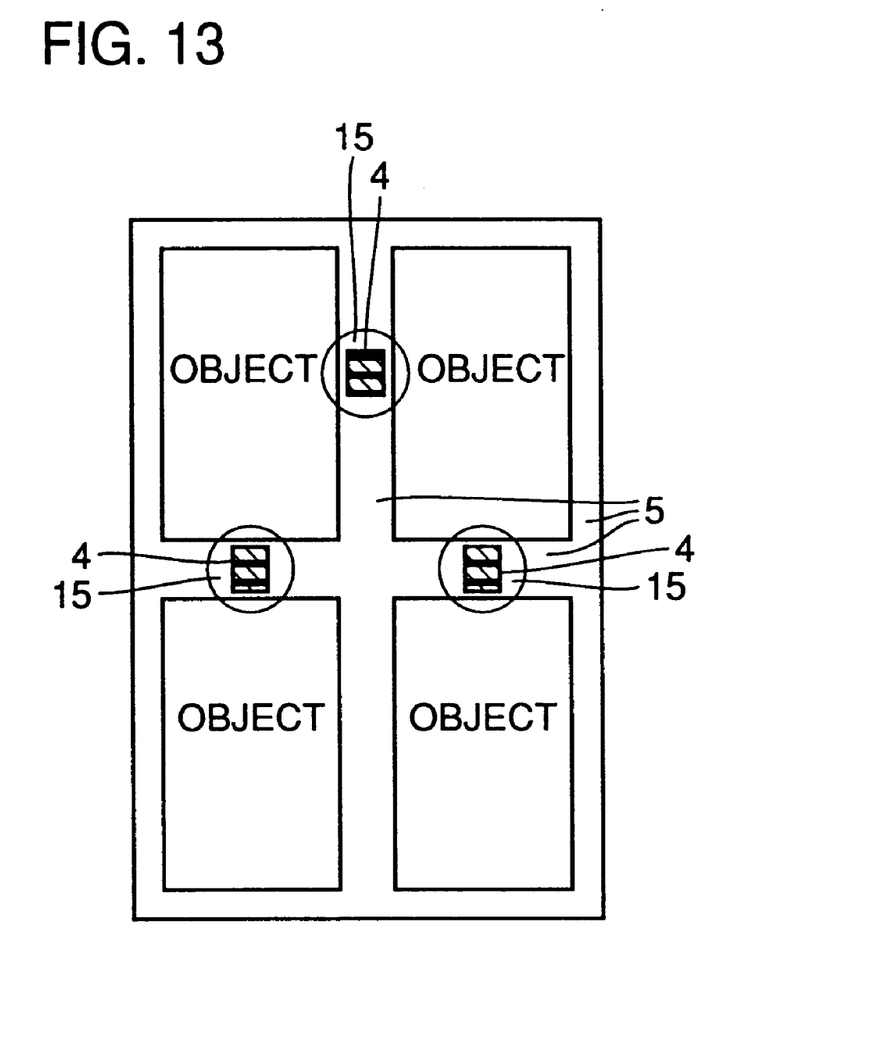
FIG. 13 is a plan view of a semiconductor device illustrating a method for producing the semiconductor device according to a fourth embodiment of the present invention.

FIG. 13 is a plan view of a photo-related mark part in a semiconductor device according to the fourth embodiment of the present invention.

Referring to FIG. 13, a plurality of photo-related marks 4 are in a dispersed configuration instead of a concentrated configuration, so as to prevent concentration of polishing pressure at the CMP time and to restrict the substrate shaving or dropping 15, which starts at the photo-related marks 4, to the minimum. It is preferable that the photo-related marks 4 are spaced apart by at least 1 mm. By combination with the aforesaid first and second embodiments, the third embodiment can further restrain the overpolishing in CMP. In other words, the effect produced by the first and second embodiments can be further increased.

As described above, in a method for producing a semiconductor device having a shallow trench isolation according to the first aspect of the present invention, an overpolish-preventing support member is left in the neighborhood of the photo-related mark for providing a support against overpolishing at the CMP time, thereby producing an effect that the overpolishing by CMP is prevented and the influence of the peripheries on the object part can be eliminated.

In a method for producing a semiconductor device having a shallow trench isolation according to the second aspect of the present invention, the photo-related mark is formed in a dispersed configuration instead of a concentrated configuration, so that concentration of polishing pressure at the CMP time can be prevented to restrict the substrate shaving or dropping, which starts at the photo-related marks, to the minimum.

A semiconductor device having a shallow trench isolation according to the third aspect of the present invention is formed to leave an overpolish-preventing support member in the neighborhood of the photo-related mark for providing a support against overpolishing at the CMP time, thereby producing a semiconductor device having a high reliability and good transistor characteristics, since the overpolishing by CMP is prevented to eliminate the influence of the peripheries on the object part.

In a semiconductor device having a shallow trench isolation according to the fourth aspect of the present invention, the photo-related mark is formed in a dispersed configuration instead of a concentrated configuration, thereby producing a semiconductor device having a high reliability of the gate oxide film and good transistor characteristics, since the concentration of polishing pressure at the CMP time is prevented to restrict the substrate shaving or dropping, which starts at the photo-related marks, to the minimum.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for producing a semiconductor device having a shallow trench isolation, said method including:

a first step of forming an oxide film and a nitride film successively on a semiconductor substrate in which an object part and a chip peripheral part including a dicing part are to be formed;

a second step of patterning said oxide film and nitride film so that an opening is formed in a portion of said chip peripheral part where a photo-related mark is to be formed and in a portion of said object part where a trench is to be formed;

a third step of etching a surface of said semiconductor substrate with the use of said patterned oxide film and nitride film as a mask so as to form said trench and to form a recess in the portion where said photo-related mark is to be formed;

a fourth step of forming a plasma oxide film on said semiconductor substrate so as to fill said recess and said trench;

a fifth step of forming a resist film on said plasma oxide film so as to cover said trench part and a portion of a neighborhood of said photo-related mark;

a sixth step of selectively etching said plasma oxide film with the use of said resist film as a mask so as to leave an overpolish-preventing support member in the neighborhood of said photo-related mark for providing a support member against overpolishing of the neighborhood of said photo-related mark during subsequent chemical mechanical polishing;

a seventh step of removing said resist film;

an eight step of polishing the surface of said semiconductor substrate by chemical mechanical polishing; and a ninth step of removing said nitride film and oxide film.

2. The method of producing a semiconductor device according to claim 1, wherein said etching of the sixth step is performed by selecting a pattern of said resist film so that said overpolish-preventing support member is left as a parallel stripe pattern on said plasma oxide film.

3. The method of producing a semiconductor device according to claim 1, wherein said etching of the sixth step is performed by selecting a pattern of said resist film so that said overpolish-preventing support member is left as a dot pattern near said photo-related mark.

4. The method according to claim 1, wherein said photo-related mark is formed in a dispersed configuration instead of a concentrated configuration.

* * * * *

UNITED STATES PATENT AND TRADEMARK OFFICE
CERTIFICATE OF CORRECTION

PATENT NO.   : 6,703,287 B2
DATED        : March 9, 2004
INVENTOR(S)  : Yoshitaka Fujiishi et al.

It is certified that error appears in the above-identified patent and that said Letters Patent is hereby corrected as shown below:

<u>Title page, Item [54] and Column 1, line 2,</u>
Change "INSULATION" to -- ISOLATION --

<u>Title page,</u>
Item [73], Assignee, change "Mitsubishi Denki Kabushiki Kaisha" to -- Renesas Technology Corp. --

Signed and Sealed this

Eleventh Day of January, 2005

JON W. DUDAS
*Director of the United States Patent and Trademark Office*